(12) United States Patent
Gupta et al.

(10) Patent No.: US 10,878,892 B2
(45) Date of Patent: Dec. 29, 2020

(54) INTEGRATED CIRCUIT USING DISCHARGING CIRCUITRIES FOR BIT LINES

(71) Applicant: Arm Limited, Cambridge (GB)

(72) Inventors: Lalit Gupta, Cupertino, CA (US); Jitendra Dasani, Cupertino, CA (US); Vivek Nautiyal, Milpitas, CA (US); Shri Sagar Dwivedi, San Jose, CA (US); Fakhruddin Ali Bohra, San Jose, CA (US)

(73) Assignee: Arm Limited, Cambridge (GB)

( * ) Notice: Subject to any disclaimer, the term of this patent is extended or adjusted under 35 U.S.C. 154(b) by 64 days.

(21) Appl. No.: 15/960,482

(22) Filed: Apr. 23, 2018

(65) Prior Publication Data

US 2019/0325949 A1    Oct. 24, 2019

(51) Int. Cl.
*G11C 11/419* (2006.01)
*G11C 11/412* (2006.01)
*G11C 11/418* (2006.01)

(52) U.S. Cl.
CPC .......... *G11C 11/419* (2013.01); *G11C 11/412* (2013.01); *G11C 11/418* (2013.01)

(58) Field of Classification Search
CPC .... G11C 11/419; G11C 11/412; G11C 11/418
USPC ....................................................... 365/156
See application file for complete search history.

(56) References Cited

U.S. PATENT DOCUMENTS

| | | | |
|---|---|---|---|
| 5,781,469 A | 7/1998 | Pathak et al. | |
| 7,116,574 B2* | 10/2006 | Sugahara | G11C 11/412 365/156 |
| 7,940,581 B2* | 5/2011 | Arsovski | G11C 11/419 365/154 |
| 8,451,679 B1 | 5/2013 | Sharpe-geisler et al. | |
| 8,971,084 B2 | 3/2015 | Holla et al. | |
| 8,977,933 B2 | 3/2015 | Cloetens | |
| 9,437,281 B2* | 9/2016 | Hsieh | G11C 11/419 |
| 9,842,634 B2* | 12/2017 | Jeong | G11C 11/413 |
| 2007/0217262 A1* | 9/2007 | Sachdev | G11C 8/10 365/185.16 |
| 2011/0235444 A1* | 9/2011 | Chuang | G11C 11/413 365/189.16 |
| 2015/0049540 A1* | 2/2015 | Son | G11C 7/12 365/154 |

(Continued)

*Primary Examiner* — Muna A Techane
(74) *Attorney, Agent, or Firm* — Pramudji Law Group PLLC; Ari Pramudji

(57) ABSTRACT

Various implementations described herein may refer to an integrated circuit using discharging circuitries for bit lines. In one implementation, an integrated circuit may include a memory array having memory cells, where the memory cells are arranged into columns and configured to be accessed using bit line pairs. The integrated circuit may also include discharging circuitries to selectively discharge the bit line pairs, where a respective discharging circuitry is coupled to a negative supply voltage node of a respective column of memory cells. The respective discharging circuitry may discharge a bit line pair of the respective column to a first voltage when the bit line pair is selected for a memory operation, and may discharge the bit line pair of the respective column to a second voltage when the bit line pair is not selected for a memory operation, where the second voltage is greater than the first voltage.

20 Claims, 8 Drawing Sheets

(56) References Cited

U.S. PATENT DOCUMENTS

2015/0371702 A1\* 12/2015 Wu ................... G11C 11/419
                                                      365/156
2017/0133092 A1\* 5/2017 Gupta ................ G11C 11/412
2018/0122442 A1\* 5/2018 Son ..................... G11C 7/12

\* cited by examiner

INTEGRATED CIRCUIT USING DISCHARGING CIRCUITRIES FOR BIT LINES

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Integrated circuits (IC) may be formed from arrangements of one or more input/output devices, standard devices, memory devices, and/or the like. In one scenario, memory devices may include memory arrays arranged into memory cells and the associated circuitry to write data to the memory cells and read data from the memory cells. In particular, the memory cells of a memory array, such as a random access memory (RAM) array, may be organized into rows and columns. The logic latches within these individual memory cells may be used to store a data bit that is representative of a logical "1" or "0." These memory cells may also be interconnected by word lines and pairs of complementary bit lines. In some scenarios, during periods when there is no read or write operation, pre-charge circuitry may be enabled to pre-charge the complementary bit lines to a particular voltage level.

BRIEF DESCRIPTION OF THE DRAWINGS

Implementations of various techniques will hereafter be described herein with reference to the accompanying drawings. It should be understood, however that the accompanying drawings illustrate only various implementations described herein and are not meant to limit the scope of various technologies described herein.

DETAILED DESCRIPTION

Various implementations described herein may refer to and may be directed to an integrated circuit using discharging circuitries for bit lines. For instance, in one implementation, an integrated circuit may include a memory array having a plurality of memory cells, where the memory cells are arranged into a plurality of columns and are configured to be accessed using a plurality of bit line pairs. The integrated circuit may also include a plurality of discharging circuitries configured to selectively discharge the plurality of bit line pairs, where a respective discharging circuitry is coupled to a negative supply voltage node of a respective column of memory cells. The respective discharging circuitry may include a first circuitry configured to discharge a bit line pair of the respective column of memory cells to a first voltage when the bit line pair is selected for a memory operation, and may also include a second circuitry configured to discharge the bit line pair of the respective column of memory cells to a second voltage when the bit line pair is not selected for a memory operation, where the second voltage is greater than the first voltage.

Various implementations of an integrated circuit using discharging circuitries for bit lines will now be described in more detail with reference to FIGS. 1-8.

As noted above, integrated circuits (IC) may be formed from arrangements of one or more input/output devices, standard devices, memory devices, and/or other devices. Input/output devices may be used to provide signals between the connection pins of the IC and the standard devices and memory devices arranged within the IC. Standard devices may be circuit implementations of flip-flops, arithmetic logic units, multiplexers, retention flops, balloon flops, latches, logic gates, and/or the like.

Figure 1:
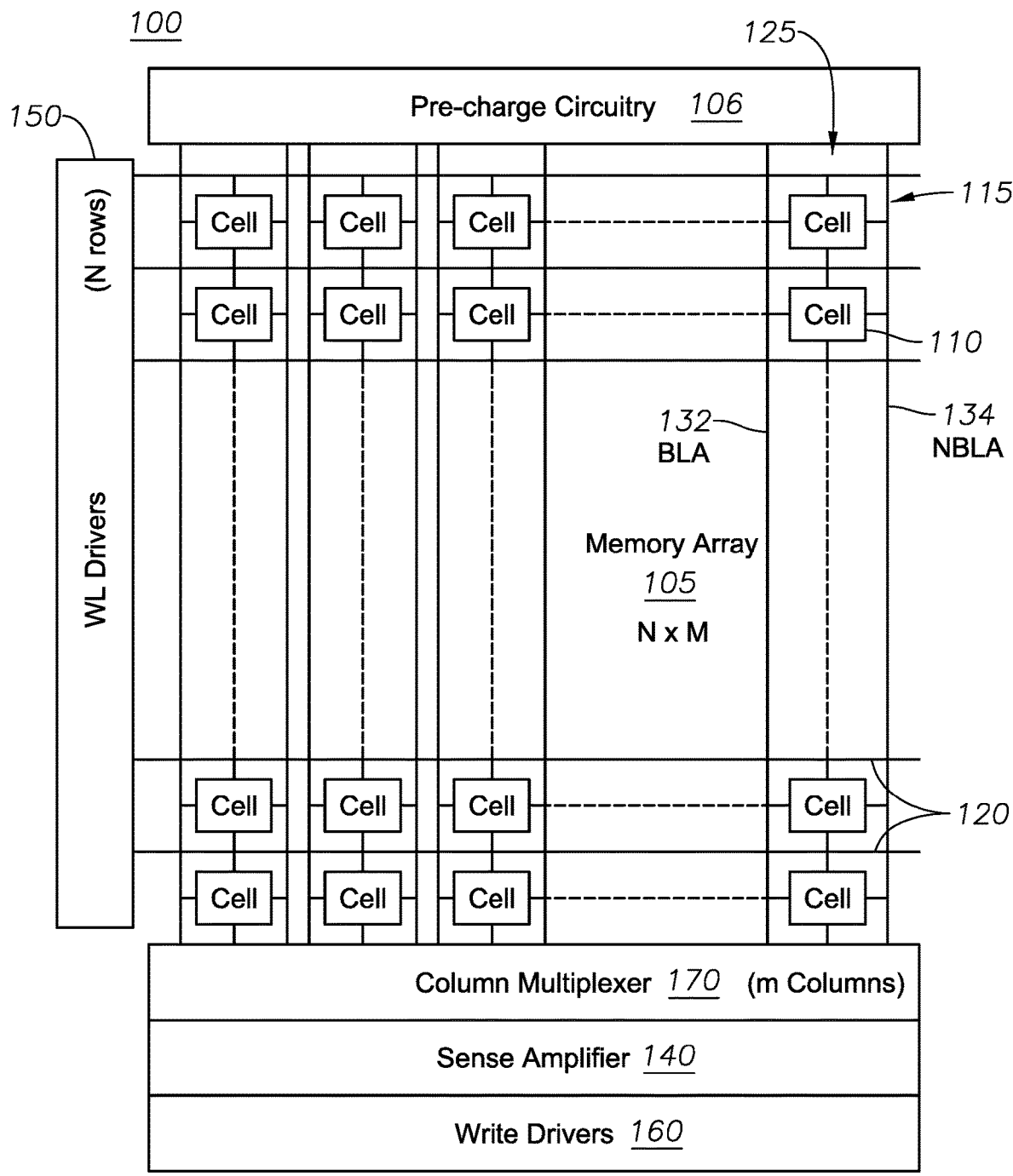
FIG. 1 illustrates a block diagram of an embedded memory device in connection with various implementations described herein.

In one example, FIG. 1 illustrates a block diagram of an embedded memory device 100 in connection with various implementations described herein. The memory device 100 may include a memory array 105, pre-charge circuitry 106, word line (WL) drivers 150, one or more column multiplexers 170, one or more sense amplifiers 140, and one or more write drivers 160. In particular, the memory array 105 may be a random-access memory (RAM) array, such as a static RAM (SRAM) array, a dynamic RAM (DRAM) array, a correlated electron RAM (ceRAM) array, a ferroelectric RAM (feRAM) array, and/or any other implementation known to those skilled in the art. In some implementations, the memory array 105 may be implemented as a single port memory array, a dual port memory array, or any other such implementation known to those skilled in the art.

The memory array 105 may include a plurality of individual memory cells 110, which may be organized in rows 115 and columns 125. As shown in FIG. 1, the array may have N rows and M columns, and, therefore, may have N×M individual memory cells 110. Each memory cell 110 may be used to store a data bit that is representative of a logical "1" or "0". As illustrated in FIG. 1, each row 115 of memory cells 110 may be connected to at least one of a plurality of word lines 120, where each word line 120 may be activated for a particular row of memory cells 110. In some implementations, each row 115 of memory cells 110 may be used to store a word of data. In other implementations, the row may store part of the word or multiple words, such as a half word or a double word.

In particular, a row decoder (not pictured) may receive address information (e.g., an address word) and then, in conjunction with one of the word line drivers 150, enable the row 115 (i.e., word line) corresponding to the address word. Each word line driver 150 may be used to drive a word line signal on a word line 120 of the memory array 105 to an asserted voltage level.

Further, each column 125 of memory cells 110 may be connected to at least one of a plurality of complementary bit lines (BL). In one implementation, a particular memory cell 110 may be coupled to at least one pair of complementary bit lines, such as BLA 132 and NBLA 134. The bit lines may be used to either store a data bit into a particular cell 110 during a write operation, or to read a stored bit from the particular cell 110 during a read operation. A column decoder (not pictured) may receive address information and enable one or more columns 125 (i.e., complementary bit line pairs) corresponding to the address. The number of columns 125 activated may depend on the size of the word to be stored.

One or more sense amplifiers 140 may be connected to the plurality of complementary bit lines. A sense amplifier 140 may amplify differential voltage signals between particular complementary bit lines of the memory array 105 during a read operation. These differential voltage signals may be representative of the data value stored in a particular individual memory cell 110, and may be amplified by the sense amplifier to a recognizable logic level to allow the data value of the cell 110 to be properly interpreted by logic outside of the memory array 105. In one implementation, one or more column multiplexers 170 may be used to multiplex the plurality of complementary bit lines into one or more sense amplifiers 140 during the read operation. In addition, as is known to those skilled in the art, the one or more write drivers 160 may be used in conjunction with the column multiplexers 170 to drive a data value onto particular complementary bit lines during a write operation. In another implementation, during periods when there is no read or write operation, the pre-charge circuitry 106 may be used to pre-charge the plurality of complementary bit lines of the memory array 105 to a particular voltage level (e.g., 1 volt (V)), as further described below. In another implementation, one or more control signals may be used to perform particular access operations with respect to the memory array 105. Such control signals may include, but are not limited to, a write column select signal, a read column select signal, a write enable signal, and/or the like.

Figure 2:
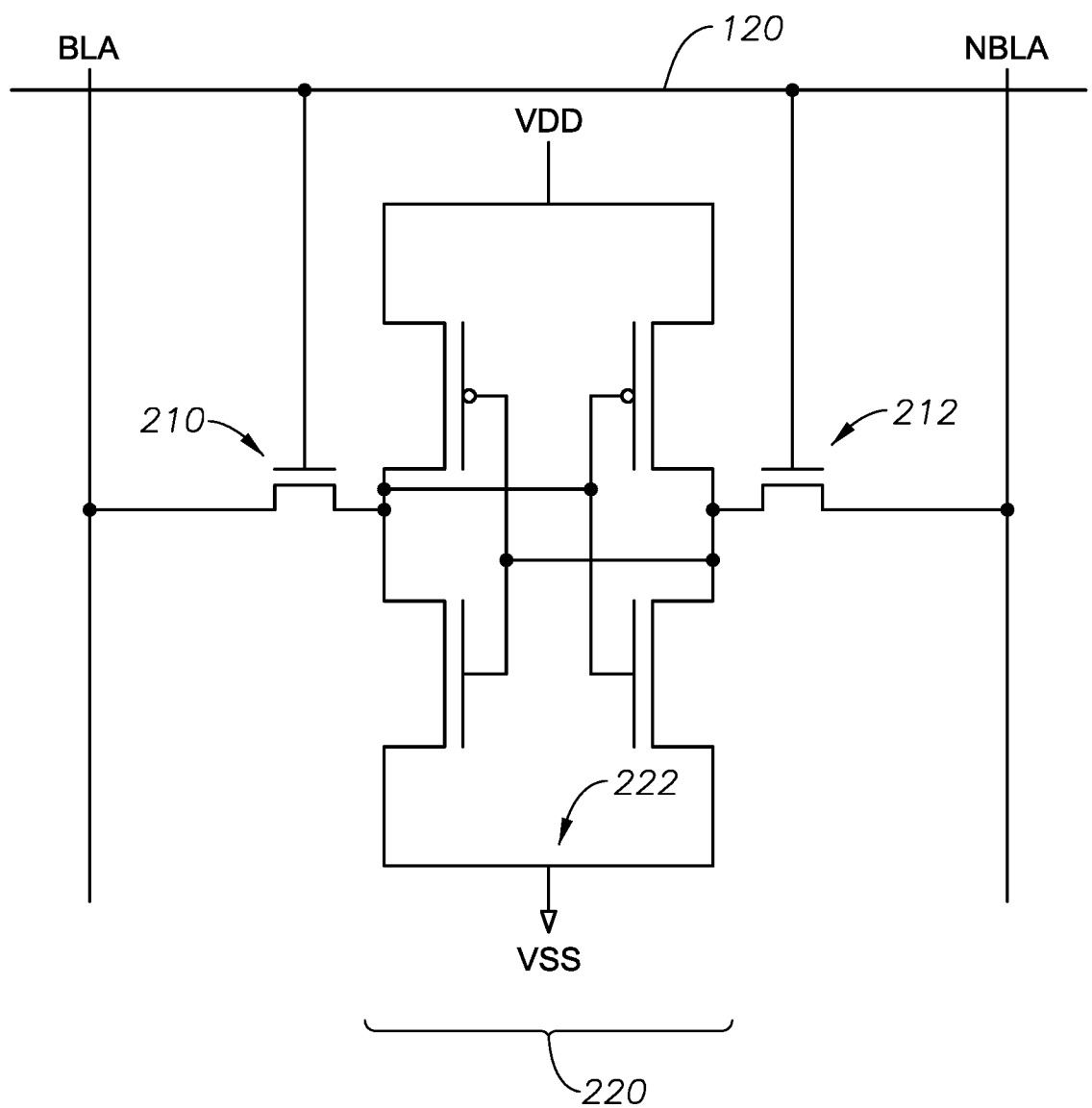
FIG. 2 illustrates a schematic diagram of a SRAM cell of a SRAM array in accordance with various implementations described herein.

As noted above, in one implementation, the memory array 105 may be a SRAM array having a plurality of SRAM cells 110. For example, FIG. 2 illustrates a schematic diagram of an SRAM cell 110 of an SRAM array 105 in accordance with various implementations described herein. As illustrated, the SRAM cell 110 may be a six transistor memory cell. However, the SRAM cell 110 may have any transistor configuration known to those skilled in the art.

Each SRAM cell 110 may include a feedback loop 220, where the feedback loop 220 may be used to hold a data value in each SRAM cell 110. The SRAM cell 110 may include two pass gate transistors 210, 212 controlled by a word line 120. The word line 120 may activate the pass gate transistors 210, 212 to connect the SRAM cell 110 to a pair of complementary bit lines BLA, NBLA.

In one implementation, and as known to those skilled in the art, in order to perform a memory operation (i.e., a read or write operation) on an SRAM array 105, an address received at a port of a memory device 100 may indicate that a particular SRAM cell 110 is to be accessed. Prior to accessing the SRAM cell 110, the complementary bit lines of the SRAM array 105, including the pair of complementary bit lines BLA, NBLA corresponding to the SRAM cell 110, may be pre-charged to a particular voltage level.

Following the pre-charge, the word line 120 corresponding to the particular SRAM cell 110 may be activated in order to connect the feedback loop 220 of the SRAM cell 110 to its corresponding pair of complementary bit lines BLA, NBLA. During a read operation, a value stored in the feedback loop 220 of the SRAM cell 110 may be transferred to the connected pair of complementary bit lines. During a write operation, a value to be written to the SRAM cell 110 may be transferred to the connected pair of complementary bit lines, and the value may then be transferred from the connected pair of complementary bit lines to the feedback loop 220 of the SRAM cell 110.

In addition, after the word line 120 is activated to connect the feedback loop 220 to the bit line pair BLA, NBLA during the memory operation, the pre-charged bit line pair may experience a discharge via a current that flows through a negative supply voltage node 222 (also labeled VSS). In one scenario, the negative supply voltage provided to the cell 110 via the node 222 may be a ground voltage (i.e., 0 V). Upon completing the memory operation, the complementary bit lines of the SRAM array 105 may again be pre-charged to the particular voltage level, including the pair of complementary bit lines BLA, NBLA used to access the SRAM cell 110 as described above.

As noted above, a memory array (e.g., memory array 105 of FIG. 1) may use column multiplexers to multiplex a plurality of complementary bit lines. In particular, as known in the art, a column multiplexer may be used to multiplex multiple complementary bit lines into a single sense amplifier during a read operation, and may be used by a write driver to multiplex multiple complementary bit lines in order to drive a data value onto a particular pair of complementary bit lines during a write operation.

As such, each column multiplexer of the memory array may be used to multiplex a portion of the complementary bit lines of the memory array. The columns of memory cells corresponding to this portion of complementary bit lines may hereinafter be referred to as a sub-array of the memory array. Each memory array may include a plurality of sub-arrays, with each sub-array having complementary pairs of bit lines that are multiplexed by a single column multiplexer for use with a common sense amplifier and/or write driver.

Figure 3:
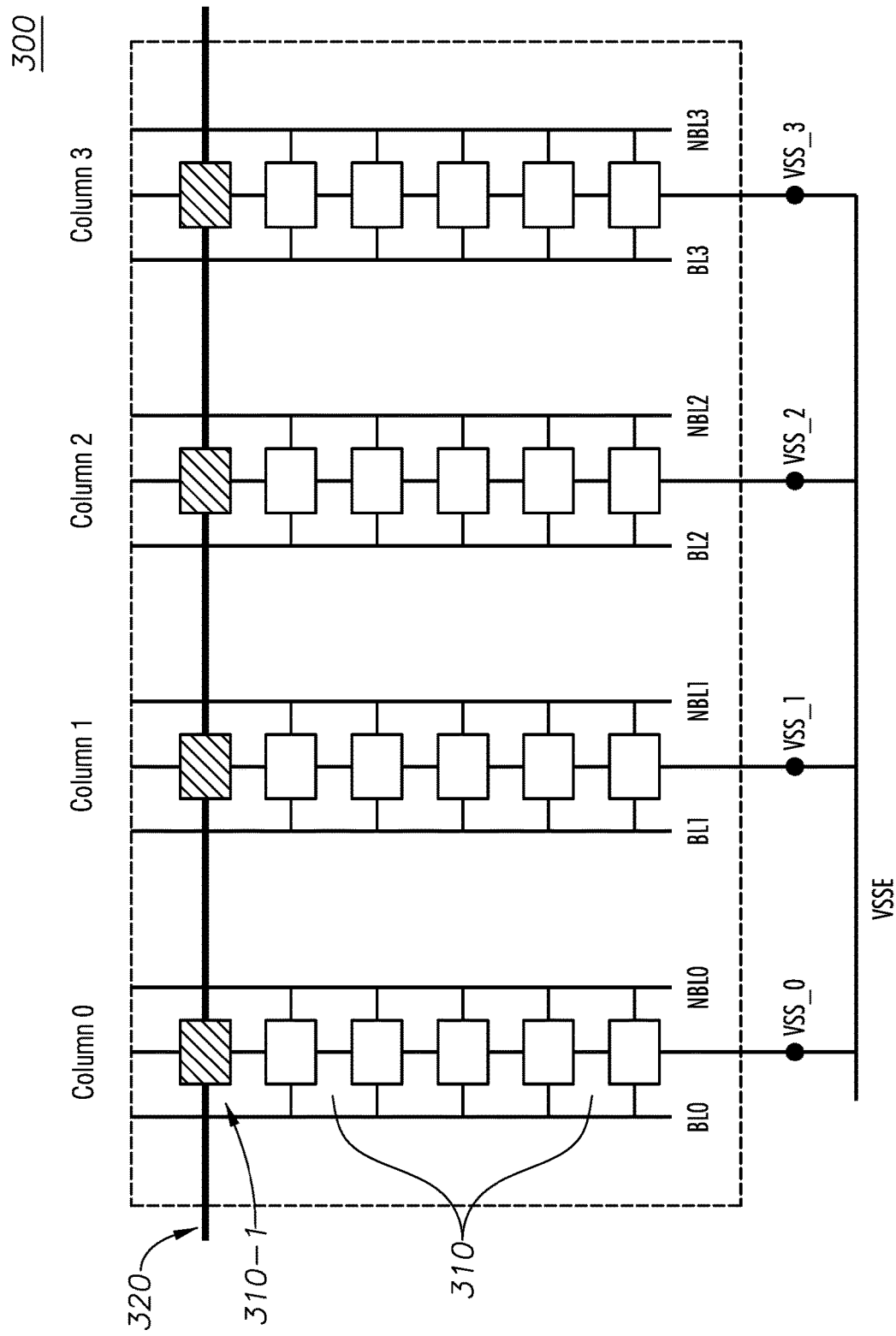
FIG. 3 illustrates a schematic diagram of a sub-array of memory cells in accordance with various implementations described herein.

For example, FIG. 3 illustrates a schematic diagram of a sub-array 300 of memory cells 310 in accordance with various implementations described herein. The memory cells 310 (including cell 310-1) may be similar to memory cell 110 described above, and the sub-array 300 may be part of a memory array, such as array 105 described above. As shown, the sub-array 300 includes four columns (column 0, column 1, column 2, and column 3) of cells 310, with each column having a corresponding pair of complementary bit lines.

While not shown in FIG. 3, a 4:1 column multiplexer may be used to select a particular pair of complementary bit lines for one column of the sub-array 300 for use with a sense amplifier during a read operation or a write driver during a write operation. In particular, as mentioned above, a column decoder (not pictured) may receive address information, where the column decoder may be used to provide column select signals (e.g., a write column select signal, a read column select signal, and/or the like) to the 4:1 column multiplexer in order to select the particular pair of complementary bit lines for the read or write operation. For example, the column multiplexer may be used to select the complementary bit lines BL0, NBL0 of column 0 for a read operation, thereby leaving the complementary bit lines of columns 1, 2, and 3 unselected. Further, as similarly discussed above, word lines of the sub-array 300 may be activated using word line drivers of the memory array.

Each memory cell 310 may have a negative supply voltage node that is similar to the node 222 of FIG. 2. As shown in FIG. 3, these nodes for the memory cells 310 of each column may be coupled to a common negative supply voltage node for the column. This common node for the column may be referred to as a column negative supply voltage node. For example, the negative supply voltage node for each memory cell of column 0 may be coupled to the column negative supply voltage node VSS_0. The memory cells 310 of column 1, column 2, and column 3 may be similarly coupled, respectively, to the column negative supply voltage nodes VSS_1, VSS_2, and VSS_3. In addition, as shown in FIG. 3, the column negative supply voltage nodes VSS_0, VSS_1, VSS_2, and VSS_3 may be coupled to an external power supply ground node VSSE, which may provide a ground voltage to the column negative supply voltage nodes.

The memory array and sub-array described above may be designed into any number of configurations known to those skilled in the art, where such configurations may be used for different purposes. In one scenario, the memory array may be configured to interleave data words, where neighboring data bits of a data word are not stored adjacent to one another within the memory array. Instead, multiple data words are interleaved into a single row of memory cells of the memory array.

The aspect ratio of such a memory array may change depending on the data word length and the number of data words stored in a row. In particular, the number of columns used within the memory array may increase, along with the number of complementary bit lines and column multiplexers.

As noted earlier, during periods when there is no read or write operation of a memory array, the pre-charge circuitry of the array may be used to pre-charge the plurality of complementary bit lines of the array to a particular voltage level. In order to perform a memory operation on a particular memory cell of the array, a word line is activated to connect the cell to its corresponding complementary bit line pair, and this bit line pair (hereinafter referred to as a selected bit line pair) is column multiplexed to a sense amplifier or write driver. And as explained above with respect to FIG. 2, during the memory operation, this pre-charged selected bit line pair may experience a discharge via a current that flows through a negative supply voltage node (e.g., node 222 of FIG. 2) of the cell being accessed. Upon completing the memory operation, the complementary bit lines of the array may again be pre-charged to the particular voltage level, including the pair of complementary bit lines used to access the particular memory cell.

However, the word line that is activated in order to access that particular memory cell is also coupled to the other memory cells of the memory array (or sub-array) positioned in the same row. As such, these other memory cells in the same row may become connected to their corresponding bit line pairs, despite no read or write operation being applied to these cells. These bit line pairs may hereinafter be referred to as unselected bit line pairs. As a result, the pre-charged unselected bit line pairs for these other memory cells may also experience a discharge via a current flowing through negative supply voltage nodes (e.g., node 222 of FIG. 2) of these cells.

Due to the discharging of the selected and unselected bit line pairs during the memory operation, significant power may be required in order to again pre-charge the complementary bit lines of the array. This issue may be worse for memory arrays having aspect ratios where the number of columns of memory cells may be relatively high, as the number of unselected bit line pairs being discharged may also be relatively high. In such instances, pre-charging the bit lines of a memory array after memory operations may become a dominant component of dynamic power requirements for an integrated circuit.

For example, looking at FIG. 3, a read operation may be performed on the sub-array 300, such that word line 320 may be activated in order to access memory cell 310-1, thereby connecting the cell 310-1 to the complementary bit lines BL0, NBL0 of column 0. As such, during the read operation, the pre-charged selected bit line pair BL0, NBL0 may experience a discharge, such as, for example, a discharge from a pre-charge voltage of 1 V to a voltage of 233 millivolts (mV). However, during the read operation, the word line 320 may also couple the memory cells of columns 1, 2, and 3 that are positioned in the same row to their respective unselected bit line pairs. As a result, the pre-charged unselected bit line pairs (BL1, NBL1, BL2, NBL2, BL3, NBL3) for these other memory cells may each experience a discharge, such as, for example, a discharge from a pre-charge voltage of 1 V to a voltage of 259 mV. Pre-charging these selected and unselected bit line pairs again after the read operation may require significant power.

In some scenarios, a discharge rate of unselected bit line pairs may be similar to, or even greater than, the discharge rate of selected bit line pairs during a read operation. Further, the discharge rate of unselected bit line pairs during a write operation may be even greater than that experienced by unselected bit line pairs during a read operation.

In view of the above, various implementations described herein may include a plurality of discharging circuitries configured to selectively discharge a plurality of bit line pairs of a memory array. Although the various implementations are described with respect to an SRAM array, other memory arrays known to those skilled in the art may be used, as well. Further, the implementations may apply to sub-arrays, as well.

Discharging Circuitry

Figure 4:
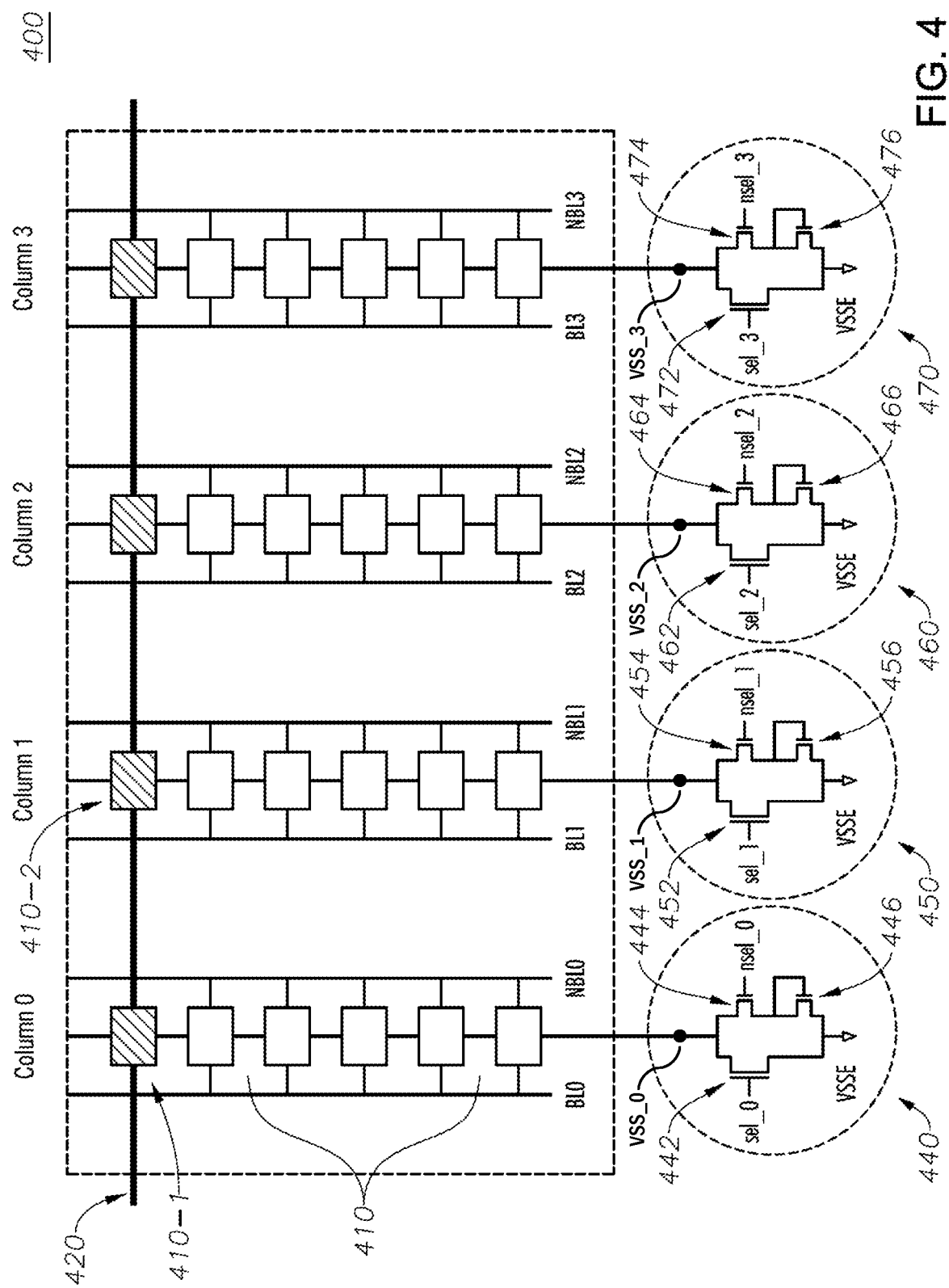
FIG. 4 illustrates a schematic diagram of a sub-array of memory cells in accordance with various implementations described herein.

In one implementation, a plurality of discharging circuitries may be coupled to columns of a memory array in order to reduce the discharging of unselected bit line pairs of the memory array during a memory operation. For example, FIG. 4 illustrates a schematic diagram of a sub-array 400 of memory cells 410 in accordance with various implementations described herein. The sub-array 400 and memory cells 410 (including cells 410-1 and 410-2) may be similar to sub-array 300 and memory cells 310 described above, and the sub-array 400 may be part of a memory array, such as array 105, described above.

As shown, the sub-array 400 includes four columns (column 0, column 1, column 2, and column 3) of cells 410, with each column having a corresponding pair of complementary bit lines (BL0, NBL0, BL1, NBL1, BL2, NBL2, BL3, NBL3). In addition, while not shown in FIG. 4, a 4:1 column multiplexer may be used to select a particular pair of complementary bit lines for one column of the sub-array 400 for use with a sense amplifier (not shown) during a read operation or a write driver (not shown) during a write operation. Other configurations of the sub-array 400, such as those with more than four columns and a different size of column multiplexer, may be used, as well. The sub-array 400 may include a plurality of word lines, though only word line 420 is shown.

As mentioned above, a column decoder (not pictured) may receive address information, where the column decoder may be used to provide column select signals to the 4:1 column multiplexer in order to select the particular pair of complementary bit lines for the read or write operation (i.e., for use with a common sense amplifier and/or write driver). These column select signals may be represented by the following complementary column select signals, and are discussed further below: sel_0, nsel_0 for selecting bit line pair BL0, NBL0; sel_1, nsel_1 for selecting bit line pair BL1, NBL1; sel_2, nsel_2 for selecting bit line pair BL2, NBL2; and sel_3, nsel_3 for selecting bit line pair BL3, NBL3. These column select signals may represent write column select signals and/or read column select signals.

Specifically, if bit line pair BL0, NBL0 of column 0 is to be selected for a read or write operation, then column select signal sel_0 may be high and its complement nsel_0 may be low. Conversely, if bit line pair BL0, NBL0 of column 0 is not selected for a read or write operation, then column select signal sel_0 may be low and its complement nsel_0 may be high. Column select signals sel_1 and nsel_1 are similarly arranged for bit line pair BL1, NBL1 of column 1, column select signals sel_2 and nsel_2 are similarly arranged for bit line pair BL2, NBL2 of column 2, and column select signals sel_3 and nsel_3 are similarly arranged for bit line pair BL3, NBL3 of column 3. Further, as similarly discussed above, word lines of the sub-array 400 may be activated using word line drivers (not shown) of the memory array.

As also shown in FIG. 4, each column of memory cells 410 may share a column negative supply voltage node among its cells. Similar to the nodes described in FIG. 3, the memory cells 410 of column 0, column 1, column 2, and column 3 may be respectively coupled to the column negative supply voltage nodes VSS_0, VSS_1, VSS_2, and VSS_3.

As shown in FIG. 4, a plurality of discharging circuitries 440, 450, 460, and 470 may be coupled to the sub-array 400. In particular, the discharging circuitry 440 may have one end coupled to column negative supply voltage node VSS_0 and another end coupled to the external power supply ground node VSSE. Similarly, the discharging circuitry 450 may have one end coupled to column negative supply voltage node VSS_1 and another end coupled to the external power supply ground node VSSE, the discharging circuitry 460 may have one end coupled to column negative supply voltage node VSS_2 and another end coupled to the external power supply ground node VSSE, and the discharging circuitry 470 may have one end coupled to column negative supply voltage node VSS_3 and another end coupled to the external power supply ground node VSSE.

As shown, discharging circuitry 440 may include a first n-type transistor device 442, such as an NMOS transistor. The discharging circuitry 440 may also include a second n-type transistor device 444 coupled in series with an n-type transistor device 446 configured as a diode (i.e., having its gate connected to its drain). In particular, the second n-type transistor device 444 and the diode device 446 may be composed of NMOS transistors.

In the discharging circuitry 440, the first transistor 442 may be coupled in parallel to the series-connected second transistor 444 and diode device 446, and the first transistor 442 may also be configured to operate as a switch. In particular, the first transistor 442 may be configured to receive column select signal sel_0 at its gate, and, when active, may be used to couple the column negative supply voltage node VSS_0 to the external power supply ground node VSSE. The second transistor 444 may also be configured to operate as a switch, where the second transistor 444 may be configured to receive the complementary column select signal nsel_0 at its gate. As such, only one of the first transistor 442 or the second transistor 444 may be active at a time. When active, the second transistor 444 may be configured to couple a drain terminal of the diode device 446 to the column negative supply voltage node VSS_0, and a source terminal of the diode device 446 to the external power supply ground node VSSE.

In addition, discharging circuitry 450 may include a first n-type transistor device 452, such as an NMOS transistor. The discharging circuitry 450 may also include a second n-type transistor device 454 coupled in series with an n-type transistor device 456 configured as a diode (i.e., having its gate connected to its drain). In particular, the second n-type transistor device 454 and the diode device 456 may be composed of NMOS transistors.

In the discharging circuitry 450, the first transistor 452 may be coupled in parallel to the series-connected second transistor 454 and diode device 456, and the first transistor 452 may also be configured to operate as a switch. In particular, the first transistor 452 may be configured to receive column select signal sel_1 at its gate, and, when active, may be used to couple the column negative supply voltage node VSS_1 to the external power supply ground node VSSE. The second transistor 454 may also be configured to operate as a switch, where the second transistor 454 may be configured to receive the complementary column select signal nsel_1 at its gate. As such, only one of the first transistor 452 or the second transistor 454 may be active at a time. When active, the second transistor 454 may be configured to couple a drain terminal of the diode device 456 to the column negative supply voltage node VSS_1, and a source terminal of the diode device 456 to the external power supply ground node VSSE.

Discharging circuitry 460 may include a first n-type transistor device 462, such as an NMOS transistor. The discharging circuitry 460 may also include a second n-type transistor device 464 coupled in series with an n-type transistor device 466 configured as a diode (i.e., having its gate connected to its drain). In particular, the second n-type transistor device 464 and the diode device 466 may be composed of NMOS transistors.

In the discharging circuitry 460, the first transistor 462 may be coupled in parallel to the series-connected second transistor 464 and diode device 466, and the first transistor 462 may also be configured to operate as a switch. In particular, the first transistor 462 may be configured to receive column select signal sel_2 at its gate, and, when active, may be used to couple the column negative supply voltage node VSS_2 to the external power supply ground node VSSE. The second transistor 464 may also be configured to operate as a switch, where the second transistor 464 may be configured to receive the complementary column select signal nsel_2 at its gate. As such, only one of the first transistor 462 or the second transistor 464 may be active at a time. When active, the second transistor 464 may be configured to couple a drain terminal of the diode device 466 to the column negative supply voltage node VSS_2, and a source terminal of the diode device 466 to the external power supply ground node VSSE.

Discharging circuitry 470 may include a first n-type transistor device 472, such as an NMOS transistor. The discharging circuitry 470 may also include a second n-type transistor device 474 coupled in series with an n-type transistor device 476 configured as a diode (i.e., having its gate connected to its drain). In particular, the second n-type transistor device 474 and the diode device 476 may be composed of NMOS transistors.

In the discharging circuitry 470, the first transistor 472 may be coupled in parallel to the series-connected second transistor 474 and diode device 476, and the first transistor 472 may also be configured to operate as a switch. In particular, the first transistor 472 may be configured to receive column select signal sel_3 at its gate, and, when active, may be used to couple the column negative supply voltage node VSS_3 to the external power supply ground node VSSE. The second transistor 474 may also be configured to operate as a switch, where the second transistor 474 may be configured to receive the complementary column select signal nsel_3 at its gate. As such, only one of the first transistor 472 or the second transistor 474 may be active at a time. When active, the second transistor 474 may be configured to couple a drain terminal of the diode device 476 to the column negative supply voltage node VSS_3, and a source terminal of the diode device 476 to the external power supply ground node VSSE.

In operation, the plurality of discharging circuitries 440, 450, 460, and 470 coupled to the sub-array 400 may be used to reduce the discharging of unselected bit line pairs of the sub-array 400 during a memory operation. In particular, the first transistors 442, 452, 462, and 472 may be used to discharge selected bit line pairs of the sub-array 400 using the external power supply ground node VSSE, whereas the second transistors 444, 454, 464, and 474 may be used to discharge unselected bit line pairs of the sub-array 400 using the diode devices 446, 456, 466, and 476.

For example, a column decoder (not pictured) may receive address information indicating that memory cell 410-1 is to be accessed for a memory operation (i.e., a read or write operation). The column decoder may be used to provide column select signals (e.g., a write column select signal, a read column select signal, and/or the like) to the 4:1 column multiplexer in order to select the complementary bit line pair BL0, NBL0 for use with a common sense amplifier and/or write driver.

As mentioned above, these column select signals include sel_0, nsel_0 for selecting bit line pair BL0, NBL0; sel_1, nsel_1 for selecting bit line pair BL1, NBL1; sel_2, nsel_2 for selecting bit line pair BL2, NBL2; and sel_3, nsel_3 for selecting bit line pair BL3, NBL3. To select the complementary bit line pair BL0, NBL0 for accessing cell 410-1, the column select signal sel_0 received by the column multiplexer may be set high and its complement nsel_0 may be set low. Further, the remaining bit line pairs of the sub-array 400 are to be unselected bit line pairs during the memory operation, so column select signals sel_1, sel_2, and sel_3 may be low, and their complements nsel_1, nsel_2, and nsel_3 may be high.

Further, as shown in FIG. 4, these column select signals are also provided to the plurality of discharging circuitries 440, 450, 460, and 470. In this example, the high sel_0 signal may activate the first transistor 442 of the discharging circuitry 440, thereby coupling the column negative supply voltage node VSS_0 to the external power supply ground node VSSE. The low nsel_0 signal may also render the second transistor 444 (and thus diode device 446) as inactive. In addition, the high nsel_1 signal may activate the second transistor 454 of the discharging circuitry 450, thereby coupling a drain terminal of the diode device 456 to the column negative supply voltage node VSS_1, and a source terminal of the diode device 456 to the external power supply ground node VSSE. The low sel_1 signal may also render the first transistor 452 as inactive. Similarly, the high nsel_2 signal may activate the second transistor 464 of the discharging circuitry 460, thereby coupling a drain terminal of the diode device 466 to the column negative supply voltage node VSS_2, and a source terminal of the diode device 466 to the external power supply ground node VSSE. The low sel_2 signal may also render the first transistor 462 as inactive. Further, the high nsel_3 signal may activate the second transistor 474 of the discharging circuitry 470, thereby coupling a drain terminal of the diode device 476 to the column negative supply voltage node VSS_3, and a source terminal of the diode device 476 to the external power supply ground node VSSE. The low sel_3 signal may also render the first transistor 472 as inactive.

To perform the memory operation on cell 410-1, a word line 420 may be activated, thereby connecting the cell 410-1 to the selected complementary bit lines BL0, NBL0 of column 0. Prior to activating the word line 420, the voltages at each of the column negative supply voltage nodes VSS_0, VSS_1, VSS_2, and VSS_3 may be approximately equal to a voltage provided at node VSSE (e.g., a ground voltage).

Figure 5:
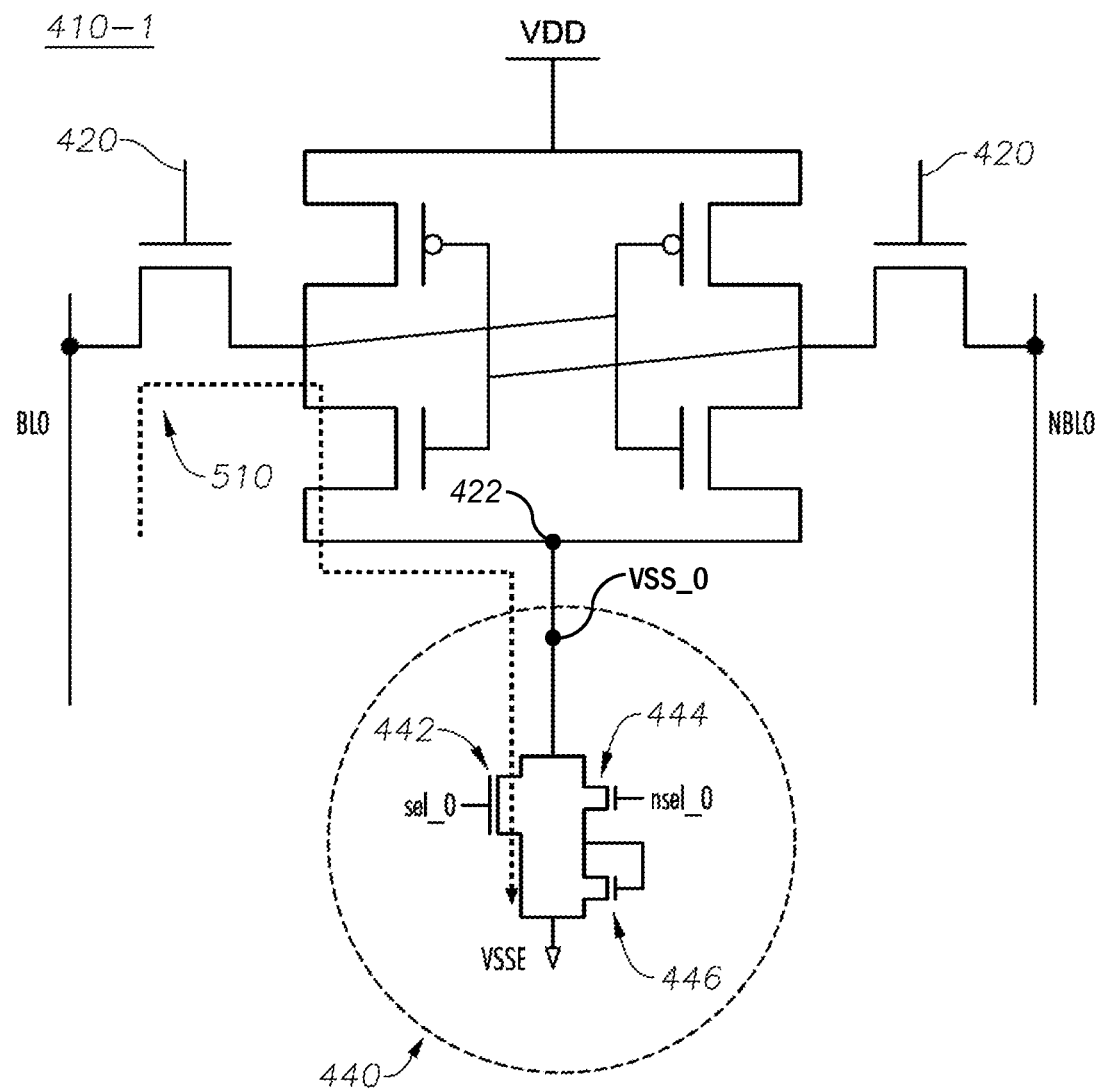
FIG. 5 illustrates a schematic diagram of memory cell in accordance with various implementations described herein.

After activating the word line 420, during the memory operation, the pre-charged selected bit line pair BL0, NBL0 may experience a discharge from its initial voltage level (e.g., 1 V) via a current that flows through a negative supply voltage node of the cell 410-1. For example, FIG. 5 illustrates a schematic diagram of memory cell 410-1 in accordance with various implementations described herein. As shown, the memory cell 410-1 may be a SRAM cell, similar to that described above with respect to FIG. 2.

As also shown, a negative supply voltage node 422 of the memory cell 410-1 may be coupled to the column negative supply voltage node VSS_0. The negative supply voltage node 422 may be similar to negative supply voltage nodes described above with respect to FIGS. 2 and 3, such as node 222 of FIG. 2. As such, the negative supply voltage node 422 may be coupled to the discharging circuitry 440 via the column negative supply voltage node VSS_0.

As mentioned above, the high sel_0 signal may activate the first transistor 442 of the discharging circuitry 440, thereby coupling the node VSS_0 to the external power supply ground node VSSE. The low nsel_0 signal may render the second transistor 444 (and thus diode device 446) as inactive.

During the memory operation, the word line 420 may be activated, thereby coupling the pre-charged selected bit line pair BL0, NBL0 to the cell 410-1. As such, during the memory operation, the pre-charged selected bit line pair BL0, NBL0 may experience a discharge via a current that flows to the external power supply ground node VSSE by way of a path 510 formed using the negative supply voltage node 422, the column negative supply voltage node VSS_0, and the first transistor 442.

In such an example, during the memory operation, the column negative supply voltage node VSS_0 may be driven toward a voltage level that is substantially equal to the voltage at node VSSE (e.g., 0 V). The discharge experienced by the selected bit line pair BL0, NBL0 may be significant, as similarly described above with respect to FIG. 3. For example, during a read operation, the pre-charged selected bit line pair BL0, NBL0 may discharge from a pre-charge voltage of 1 V to a voltage of about 300 mV.

In addition, after activating the word line 420, during the memory operation, the pre-charged unselected bit line pairs of the sub-array 400 may also experience discharging from initial voltage levels (e.g., 1 V). As mentioned above, the activated word line 420 is also coupled to other memory cells 410 in the same row as cell 410-1. As such, these other memory cells 410 in the same row may become connected to their corresponding unselected bit line pairs (BL1, NBL1, BL2, NBL2, BL3, NBL3), despite no read or write operation being applied to these cells. These other memory cells 410 may include the memory cell 410-2 of column 1, having an associated unselected bit line pair BL1, NBL1.

Figure 6:
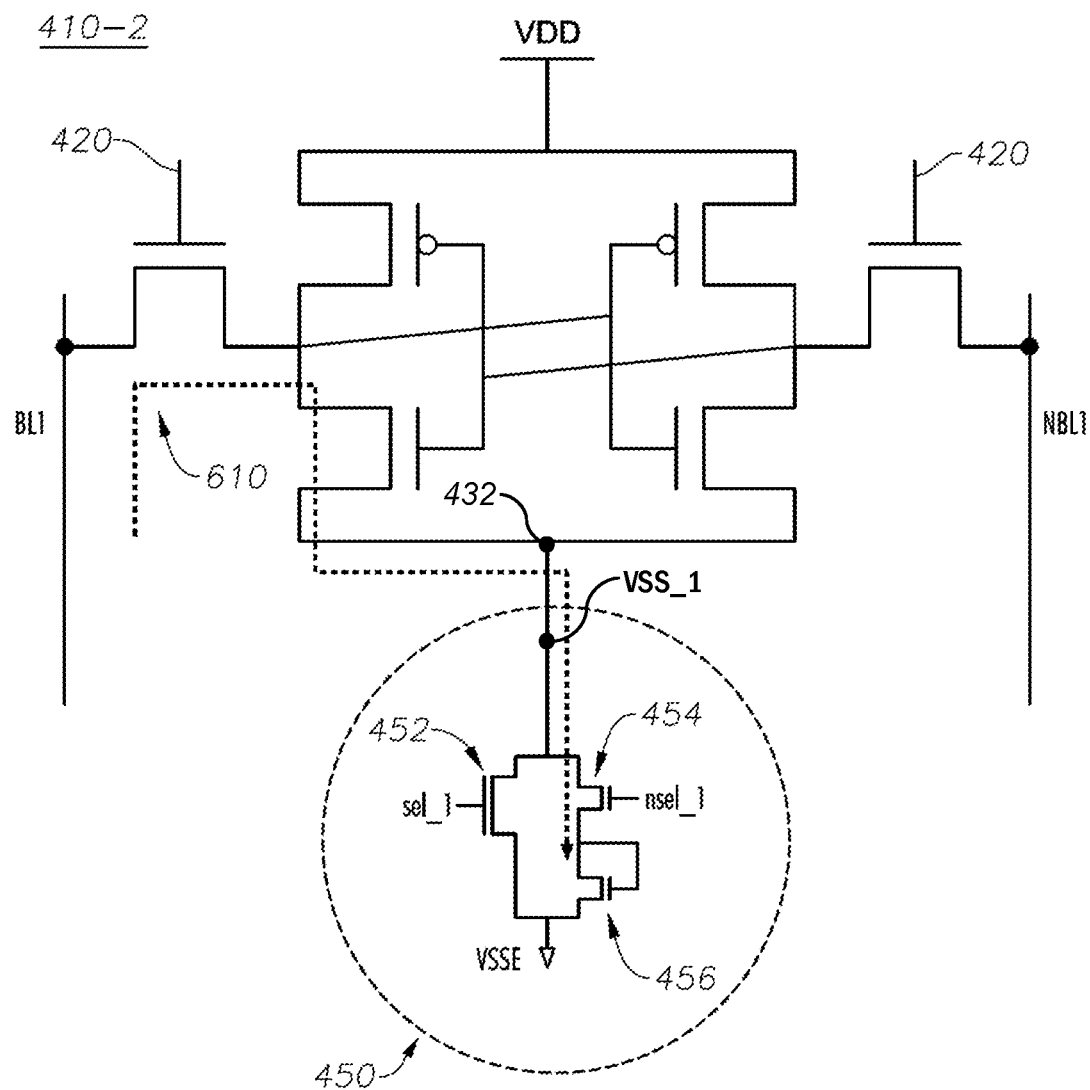
FIG. 6 illustrates a schematic diagram of memory cell in accordance with various implementations described herein.

FIG. 6 illustrates a schematic diagram of memory cell 410-2 in accordance with various implementations described herein. As shown, the memory cell 410-2 may be a SRAM cell, similar to that described above with respect to FIG. 2. As also shown, a negative supply voltage node 432 of the memory cell 410-2 may be coupled to the column negative supply voltage node VSS_1. The negative supply voltage node 432 may be similar to negative supply voltage nodes described above with respect to FIGS. 2 and 3, such as node 222 of FIG. 2. As such, the negative supply voltage node 432 may be coupled to the discharging circuitry 450 via the column negative supply voltage node VSS_1.

As mentioned above, the high nsel_1 signal may activate the second transistor 454 of the discharging circuitry 450, thereby coupling a drain terminal of the diode device 456 to the column negative supply voltage node VSS_1, and a source terminal of the diode device 456 to the external power supply ground node VSSE. The low sel_1 signal may also render the first transistor 452 as inactive.

During the memory operation, the word line 420 may be activated, thereby coupling the pre-charged unselected bit line pair BL1, NBL1 to the cell 410-2. As such, during the memory operation, the pre-charged unselected bit line pair BL1, NBL1 may experience a discharge via a current that flows to the diode device 456 by way of a path 610 formed using the negative supply voltage node 432, the column negative supply voltage node VSS_1, and the second transistor 454. In such an example, during the memory operation, the current may drive a voltage at the column negative supply voltage node VSS_1 toward a threshold voltage (Vt) of the diode device 456.

The amount of discharge experienced by the unselected bit line pair BL1, NBL1 may be limited to the voltage at the node VSS_1. In one implementation, the voltage at the node VSS_1 may not be greater than the threshold voltage of the diode device 456. As such, the amount of discharge experienced by the unselected bit line pair BL1, NBL1 may be limited to be no more than this threshold voltage. In such a manner, the diode device 456 may operate as a clamp on the amount of discharge experienced by the unselected bit line pair BL1, NBL1.

As such, due to the diode device 456, the amount of discharge experienced by the unselected bit line pair BL1, NBL1 may be less than the amount of discharge experienced by the selected bit line pair BL0, NBL0. For example, during a read operation, the pre-charged unselected bit line pair BL1, NBL1 may discharge from a pre-charge voltage of 1 V to a voltage of about 600 mV. In comparison, during a read operation, the pre-charged selected bit line pair BL0, NBL0 may discharge from a pre-charge voltage of 1 V to a voltage of about 300 mV. In such an example, the selected bit line pair BL0, NBL0 may discharge about 300 mV more than the unselected bit line pair BL1, NBL1.

Returning to FIG. 4, the other memory cells 410 in the same row as cell 410-2 that are also connected to their corresponding unselected bit line pairs (BL2, NBL2, BL3, NBL3) may operate in the same manner, where these cells 410 may use the diode devices (466, 476) of their respective discharging circuitries (460, 470) to limit the amount of discharge experienced by the unselected bit line pairs.

As such, in the sub-array 400, the selected bit line pair BL0, NBL0 may be the only bit line pair to experience significant discharge during a memory operation on cell 410-1. The remaining bit line pairs of the sub-array 400 may have their discharges limited to no more than the threshold voltages of their respective diode devices. In a further implementation, the diode devices 446, 456, 466, and 476 may be selected such that the column negative supply voltage nodes are not driven to threshold voltages that may lead to retention issues of the cells 410.

In some implementations, other columns of cells 410 not shown in FIG. 4 may also use similar discharging circuitry to limit the discharge experienced by unselected bit line pairs. By reducing the amount of discharge experienced by unselected bit line pairs of a memory array during memory operations, the amount of power required to again pre-charge the complementary bit lines of the array after the operation may also be reduced.

As explained above, the voltages at column negative supply voltage nodes for columns having unselected bit line pairs may be driven towards threshold voltages of diode devices during a memory operation. For example, a current that flows to the diode device 456 by way of a path 610 may drive a voltage at the column negative supply voltage node VSS_1 toward a threshold voltage of the diode device 456. In such implementations, the rate at which voltages at the column negative supply voltage nodes reach the threshold voltages may depend on a number of factors, such as the word line pulse width when activating a word line during the memory operation, the process corner used, whether the memory operation is a read or write operation, and so forth. For example, the rate at which voltage at the node VSS_1 reaches the threshold voltage may increase as the size of the word line pulse width increases for the word line 420 during a memory operation. In some implementations, multiple cycles of a memory operation may be needed before the voltages at these column negative supply voltage nodes can reach their respective threshold voltages. With each repeated cycle of the memory operation, however, the voltages at these column negative supply voltage nodes may continuously increase until the respective threshold voltages are reached.

Furthermore, after a memory operation, the voltages at column negative supply voltage nodes for columns having unselected bit line pairs may be driven towards threshold voltages of diode devices, where such voltages may remain at the nodes after a memory operation has completed. However, if the next memory operation is a read operation on a memory cell of one of these columns, then the voltage at the column negative supply voltage node for this column may interfere with the read operation (e.g., slowing the operation). As such, to avoid this interference, the column selection signal for a first transistor of the discharging circuitry coupled to the column may be set high prior to a word line being activated for the read operation. This may lead to the column negative supply voltage node being discharged prior to the read operation on a cell of the column.

For example, in FIG. 4, a voltage may remain at the column negative supply voltage node VSS_1 after a particular memory operation. If the next operation is a read operation of cell 410-2, then the sel_1 signal may be set high prior to the word line 420 being activated. The high sel_1 signal may activate the first transistor 452 of the discharging circuitry 450, thereby coupling the node VSS_1 to the external power supply ground node VSSE and discharging the node VSS_1 prior to the word line 420 activation.

As explained above, the discharging circuits for use in reducing the discharging of unselected bit line pairs may make use of diode devices and transistors. However, these diode devices and transistors may be subject to manufacturing variations, which may alter their failure rate or effectiveness. As such, different configurations of the discharging circuits may be used to minimize the effects of these variations.

Figure 7:
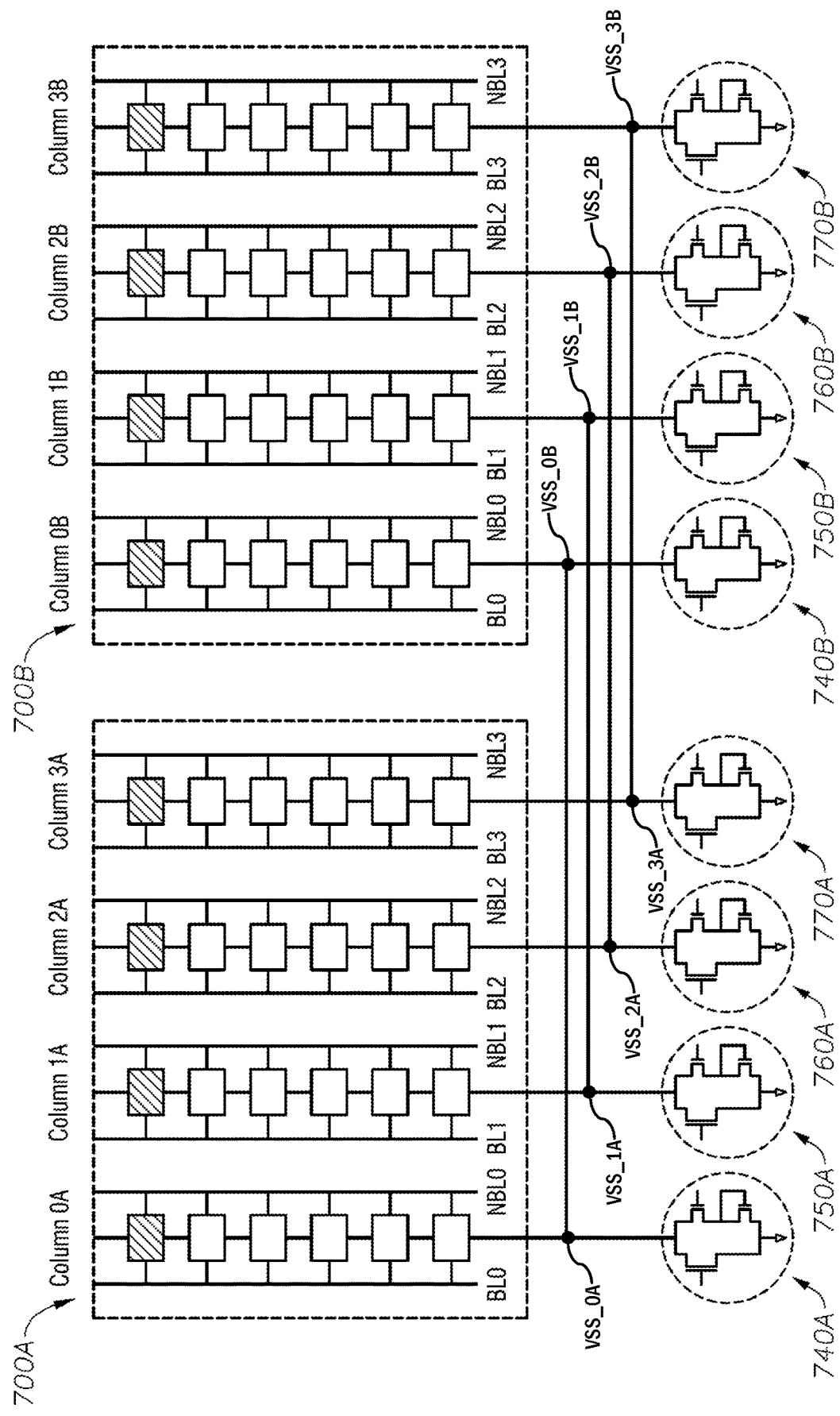
FIG. 7 illustrates a schematic diagram of interleaved sub-arrays in accordance with various implementations described herein.

For example, FIG. 7 illustrates a schematic diagram of interleaved sub-arrays 700A and 700B in accordance with various implementations described herein. The sub-arrays 700A and 700B may be similar in structure as the sub-array 400 described above.

In particular, the sub-array 700A may includes four columns (column 0A, column 1A, column 2A, and column 3A) of cells, and the sub-array 700B may includes four columns (column 0B, column 1B, column 2B, and column 3B) of cells. Though not shown, each sub-array may have its own column select signals, column multiplexer, sense amplifier, and write driver.

In addition, as similarly shown in FIG. 4, a plurality of discharging circuitries 740A, 750A, 760A, and 770A may be coupled to the sub-array 700A, and a plurality of discharging circuitries 740B, 750B, 760B, and 770B may be coupled to the sub-array 700B. Similar to the nodes described in FIG. 4, the plurality of discharging circuitries 740A, 750A, 760A, and 770A may be coupled to the sub-array 700A via column negative supply voltage nodes VSS_0A, VSS_1A, VSS_2A, and VSS_3A. In addition, the plurality of discharging circuitries 740B, 750B, 760B, and 770B may be coupled to the sub-array 700B via column negative supply voltage nodes VSS_0B, VSS_1B, VSS_2B, and VSS_3B. As shown in FIG. 7, the nodes VSS_0A and VSS_0B may be coupled, the nodes VSS_1A and VSS_1B may be coupled, the nodes VSS_2A and VSS_2B may be coupled, and the nodes VSS_3A and VSS_3B may be coupled.

By coupling the column negative supply voltage nodes in such a manner, the effects from variations of the diode devices and transistors of the discharging circuitries may be minimized. For example, if a diode device or transistor for discharging circuitry 750A fails, then the bit line pair associated with column 1A may be discharged with the assistance of discharging circuitry 750B. In particular, the diode device for the discharging circuitry 750A may be manufactured such that its threshold voltage is large enough to cause data retention issues at node VSS_1A. Accordingly, in the arrangement of FIG. 7, the node VSS_1A may be driven to an average of this threshold voltage and the threshold voltage of the diode device of discharging circuitry 750B. This averaged threshold voltage may be low enough to avoid data retention issues for column 1A.

Figure 8:
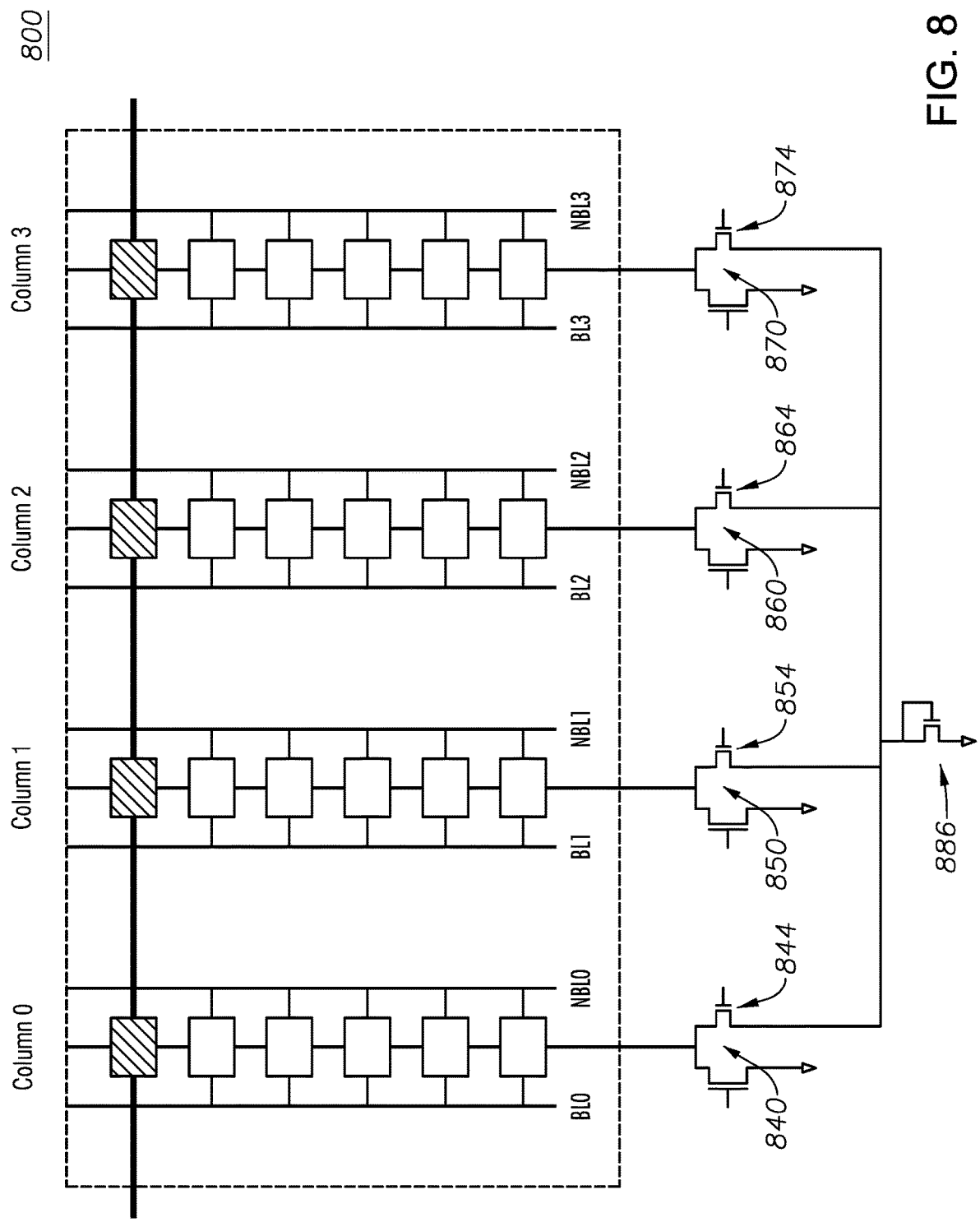
FIG. 8 illustrates a schematic diagram of a sub-array in accordance with various implementations described herein.

In another example, FIG. 8 illustrates a schematic diagram of a sub-array 800 in accordance with various implementations described herein. The sub-array 800 may be similar in structure as the sub-array 400 described above. The sub-array 800 may include four columns (column 0, column 1, column 2, and column 3) of cells. As also shown in FIG. 8, a plurality of discharging circuitries 840, 850, 860, and 870 may be coupled to the sub-array 800 using column negative supply voltage nodes, as similarly done with respect to FIG. 4.

The discharging circuitries 840, 850, 860, and 870 are the same as those discussed above in FIG. 4, except the diode device 886 is shared with each circuitry. In particular, the second transistors 844, 854, 864, and 874 are coupled to the diode device 886 in parallel, as opposed to being coupled in series as described in other implementations. In such an implementation, the diode device 886 may be larger than those described earlier.

By using such a configuration, the column negative supply voltage nodes may be driven to an averaged threshold voltage, where this voltage is averaged among the four discharging circuitries. Using an averaged threshold voltage may allow for a greater assurance that the diode device of a discharging circuitry will not cause data retention issues for the sub-array 800.

Further, the discharging circuitries may be controlled using clock gated signals, which may impact performance as an overlap check with respect to word lines may need clean up. To do so, the activation of word lines may be delayed. The clock gated signals may not be needed for certain process corners, and can be disabled using input pins.

Accordingly, in view of the implementations discussed above with respect to FIGS. 1-8, one or more discharging circuitries may be used to reduce bit line discharge for unselected bit line pairs during a memory operation, and may also reduce standby or active leakage current. The implementations may be of particular use for saving power in overdrive and super overdrive voltage domains, where memory arrays may have sufficient read/write and noise margins. By reducing the amount of discharge experienced by unselected bit line pairs of a memory array during memory operations, the amount of power required again pre-charge the complementary bit lines of the array after the operation may also be reduced.

The description provided herein may be directed to specific implementations. It should be understood that the discussion provided herein is provided for the purpose of enabling a person with ordinary skill in the art to make and use any subject matter defined herein by the subject matter of the claims.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve a developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   a memory array comprising a plurality of memory cells, wherein the memory cells are arranged into a plurality of columns and are configured to be accessed using a plurality of bit line pairs; and
   a plurality of discharging circuitries configured to selectively discharge the plurality of bit line pairs, wherein a respective discharging circuitry is coupled to a negative supply voltage node of a respective column of memory cells, and wherein the respective discharging circuitry comprises:
      a first circuitry configured to discharge a bit line pair of the respective column of memory cells to a first voltage when the bit line pair is selected for a memory operation; and
      a second circuitry configured to discharge the bit line pair of the respective column of memory cells to a second voltage when the bit line pair is not selected for a memory operation, wherein the second voltage is greater than the first voltage.

2. The integrated circuit of claim 1, wherein the negative supply voltage node of the respective column is coupled to each negative supply voltage node of the memory cells of the respective column.

3. The integrated circuit of claim 1, wherein the first circuitry and the second circuitry are coupled in parallel, and wherein one of the first circuitry and the second circuitry is configured to be active at a time.

4. The integrated circuit of claim 1, wherein the respective discharging circuitry has one end coupled to the negative supply voltage node of the respective column and another end coupled to an external power supply ground node.

5. The integrated circuit of claim 1, wherein the first circuitry comprises an NMOS transistor configured to receive a column select signal at its gate, and wherein the column select signal is high when the bit line pair of the respective column is selected.

6. The integrated circuit of claim 1, wherein the first circuitry is configured to couple the negative supply voltage node of the respective column to an external negative supply voltage node when the bit line pair of the respective column is selected.

7. The integrated circuit of claim 6, wherein the first circuitry is configured to discharge the bit line pair via a current flowing from the bit line pair to the external negative supply voltage node.

8. The integrated circuit of claim 6, wherein the negative supply voltage node of the respective column is driven to a voltage level that is substantially equal to a voltage level of the external negative supply voltage node when the bit line pair is selected.

9. The integrated circuit of claim 1, wherein the second circuitry comprises an NMOS transistor coupled in series with an NMOS diode device.

10. The integrated circuit of claim 9, wherein the NMOS diode device is configured to have a drain coupled to the negative supply voltage node of the respective column and a source couple to an external negative supply voltage node when the bit line pair is not selected.

11. The integrated circuit of claim 9, wherein the NMOS transistor is configured to receive a complementary column select signal at its gate, and wherein the complementary column select signal is high when the bit line pair is not selected.

12. The integrated circuit of claim 9, wherein the NMOS diode device is configured to drive a voltage level of the negative supply voltage node of the respective column toward a threshold voltage of the NMOS diode device when the bit line pair is not selected.

13. The integrated circuit of claim 12, wherein the voltage level of the negative supply voltage node of the respective column is less than or equal to the threshold voltage of the NMOS diode device when the bit line pair is not selected.

14. The integrated circuit of claim 12, wherein the voltage level of the negative supply voltage node of the respective column increases for every memory operation in which the bit line pair is not selected.

15. The integrated circuit of claim 12, wherein the bit line pair is configured to discharge an amount of voltage that is less than or equal to the threshold voltage when the bit line pair is not selected.

16. The integrated circuit of claim 1, wherein the discharge circuitry is configured to receive a high column select signal prior to a word line activation if a voltage level of the negative supply voltage node is greater than zero.

17. The integrated circuit of claim 1, wherein:
   the first circuitry and the second circuitry are coupled in parallel;
   the first circuitry comprises a first NMOS transistor; and
   the second circuitry comprises a second NMOS transistor coupled in series with an NMOS diode device.

18. The integrated circuit of claim 17, wherein:
   the first NMOS transistor is configured to receive a column select signal at its gate, and wherein the column select signal is high when the bit line pair of the respective column is selected; and the second NMOS transistor is configured to receive a complementary column select signal at its gate, and wherein the complementary column select signal is high when the bit line pair of the respective column is not selected.

19. The integrated circuit of claim 1, wherein the negative supply voltage node of the respective column is coupled to a negative supply voltage node of each memory cell of the respective column.

20. The integrated circuit of claim 1, wherein the respective discharging circuitry is configured to discharge the bit line pair of the respective column via a path, wherein the path comprises the negative supply voltage node of the respective column and a negative supply voltage node of a memory cell of the respective column coupled to an activated word line.

* * * * *